(12) United States Patent
Zimmermann et al.

(10) Patent No.: US 10,416,201 B2
(45) Date of Patent: Sep. 17, 2019

(54) METHOD AND APPARATUS FOR ESTIMATING AN RMS CURRENT OF AN INTERMEDIATE CIRCUIT CAPACITOR FOR AN INVERTER

(71) Applicant: Robert Bosch GmbH, Stuttgart (DE)

(72) Inventors: Daniel Zimmermann, Nienburg (DE); Christian Djonga, Heilbronn (DE); Michele Hirsch, Esslingen (DE)

(73) Assignee: Robert Bosch GmbH, Stuttgart (DE)

( * ) Notice: Subject to any disclaimer, the term of this patent is extended or adjusted under 35 U.S.C. 154(b) by 133 days.

(21) Appl. No.: 15/561,570

(22) PCT Filed: Feb. 10, 2016

(86) PCT No.: PCT/EP2016/052756
§ 371 (c)(1),
(2) Date: Sep. 26, 2017

(87) PCT Pub. No.: WO2016/155925
PCT Pub. Date: Oct. 6, 2016

(65) Prior Publication Data
US 2018/0088154 A1  Mar. 29, 2018

(30) Foreign Application Priority Data

Apr. 1, 2015  (DE) .................. 10 2015 205 961

(51) Int. Cl.
*G01R 19/02* (2006.01)
*H02P 23/14* (2006.01)
*H02P 27/08* (2006.01)

(52) U.S. Cl.
CPC .............. *G01R 19/02* (2013.01); *H02P 23/14* (2013.01); *H02P 27/08* (2013.01)

(58) Field of Classification Search
CPC ......... G01R 19/02; G01R 29/04; H02P 23/14; H02P 27/08
(Continued)

(56) References Cited

U.S. PATENT DOCUMENTS 8,269,434 B2 *  9/2012  Welchko ................ B60K 1/00
                                                      318/139
8,796,982 B2 *  8/2014  Li ............................ H02P 23/12
                                                      318/706
(Continued)

FOREIGN PATENT DOCUMENTS

DE       102012215811           3/2014
DE       102012215811 A1 *      3/2014  ........ H02M 7/53875
(Continued)

OTHER PUBLICATIONS

Kolar et al., Analytical calculation of the RMS current stress on the DC-link capacitor of voltage-PWM converter systems. IEE Proc.-Electr. Power Appl., vol. 153, No. 4, Jul. 2006 (Year: 2006).*
(Continued)

*Primary Examiner* — Jermele M Hollington
*Assistant Examiner* — Sean Curtis
(74) *Attorney, Agent, or Firm* — Michael Best & Friedrich LLP (57) ABSTRACT

The invention provides a method and an apparatus for estimating an RMS current ($I_{c,rms}$) of an intermediate circuit capacitor ($C_{ZWK}$) for a complete system of a battery (1), an inverter (9) and an N-phase electrical machine (6), wherein, in the complete system, the inverter (9) converts a DC power received from the battery (1) for the purpose of energizing the electrical machine with N phase currents, and wherein the RMS current ($I_{c,rms}$) of the intermediate circuit capacitor to be estimated is calculated according to a calculation rule which is supplied with predefined switching times ($t_{Low,off}$, (Continued)

$t_{High,off}$) of the N phases of the electrical machine, measured phase currents ($IS_u$, $IS_v$, $IS_w$) of N-1 phases or N phases of the electrical machine and a predefined battery direct current ($I_{Batt}$) as input variables. This makes it possible to exactly estimate the RMS current ($I_{c,rms}$) of an intermediate circuit capacitor for any desired pulse patterns for controlling the inverter.

10 Claims, 5 Drawing Sheets

(58) Field of Classification Search
USPC .......................................................... 324/683
See application file for complete search history.

(56) References Cited

U.S. PATENT DOCUMENTS

| | | | | |
|---|---|---|---|---|
| 9,042,131 | B2* | 5/2015 | Barron | H02M 1/08 363/37 |
| 9,077,262 | B2* | 7/2015 | Melanson | H02M 1/14 |
| 9,094,018 | B2* | 7/2015 | Scholz | H03L 5/00 |
| 9,488,686 | B2* | 11/2016 | Bhandarkar | G01R 31/028 |
| 9,490,690 | B2* | 11/2016 | Bhandarkar | H02M 7/219 |
| 9,520,764 | B1* | 12/2016 | Bundschuh | H02M 1/08 |
| 9,647,568 | B1* | 5/2017 | Bundschuh | H02M 1/08 |
| 9,764,654 | B2* | 9/2017 | Malrieu | H01M 10/48 |
| 9,796,258 | B1* | 10/2017 | Bundschuh | B60K 6/42 |
| 10,291,147 | B2* | 5/2019 | Kumar | H02M 1/14 |
| 2004/0249876 | A1* | 12/2004 | Tuladhar | G01R 19/02 708/490 |
| 2011/0032734 | A1* | 2/2011 | Melanson | H02M 1/14 363/37 |
| 2014/0062356 | A1* | 3/2014 | Djonga | H02M 7/53875 318/400.04 |
| 2014/0217980 | A1* | 8/2014 | Malrieu | H01M 10/48 320/109 |
| 2015/0061569 | A1* | 3/2015 | Alexander | B60L 11/1809 320/101 |
| 2017/0310252 | A1* | 10/2017 | Krah | H02M 3/157 |
| 2018/0088154 | A1* | 3/2018 | Zimmermann | G01R 19/02 |
| 2018/0205326 | A1* | 7/2018 | Kumar | H02M 7/44 |
| 2018/0205340 | A1* | 7/2018 | Chen | H02P 25/22 |
| 2019/0002013 | A1* | 1/2019 | Terdy | B62D 5/0481 |

FOREIGN PATENT DOCUMENTS

| | | | | |
|---|---|---|---|---|
| DE | 102015205961 A1 * | 10/2016 | | G01R 19/02 |
| EP | 1988402 | 11/2008 | | |
| EP | 1988402 A2 * | 11/2008 | | G01R 21/06 |
| EP | 3278448 A1 * | 2/2018 | | G01R 19/02 |
| WO | WO-2016155925 A1 * | 10/2016 | | G01R 19/02 |

OTHER PUBLICATIONS

International Search Report for Application No. PCT/EP2016/052756 dated Jun. 23, 2016 (English Translation, 3 pages).

Kolar, J. W. et al., "Analytical calculation of the RMS current stress on the DC-link capacitor of voltage-PWM converter systems", IEEE Proceedings: Electric Power Applications, Institution of Electrical Engineers, GB, vol. 153, No. 4, Jul. 1, 2006, pp. 535-543, XP006026699.

* cited by examiner

METHOD AND APPARATUS FOR ESTIMATING AN RMS CURRENT OF AN INTERMEDIATE CIRCUIT CAPACITOR FOR AN INVERTER

BACKGROUND OF THE INVENTION

The present invention relates to a method and an apparatus for estimating an RMS current of an intermediate-circuit capacitor for an overall system made up of a battery, an inverter, and an electric machine.

In hybrid and electric vehicles, inverters or pulse-controlled inverters are used for driving the electric machines. It is not only for monitoring purposes that knowledge about a so-called RMS current of an intermediate-circuit capacitor is desirable.

The known concepts for calculating the RMS current or the intermediate-circuit capacitor perform analytical calculations which, however, apply only to specific driving methods or pulse patterns of the inverter. The known concepts therefore provide no option for calculating the RMS current of the intermediate-circuit capacitor for any arbitrary driving methods and operating points of the inverter and the electric machine.

SUMMARY OF THE INVENTION

Therefore, the object of the present invention is to provide a method and an apparatus for estimating an RMS current of an intermediate-circuit capacitor for an overall system made up of a battery, an inverter, and an N-phase electric machine, wherein the method and the apparatus are to enable an exact estimation of the RMS current of the intermediate-circuit capacitor for any arbitrary driving methods and types of operation of the inverter and the electric machine.

A method is provided for estimating an RMS current of an intermediate-circuit capacitor for an overall system made up of a battery, an inverter, and an N-phase electric machine which is preferably designed as a synchronous machine, wherein in the overall system, the inverter converts direct-current power received by the battery for supplying the electric machine with N phase currents, and wherein the RMS current to be estimated of the intermediate-circuit capacitor is calculated according to a calculation specification, to which predefined switching times of the N phases of the electric machine, measured phase currents of N−1 phases or N phases of the electric machine, and a predefined battery direct current are supplied as input variables. The term "battery" is to be understood to mean any energy storage device which can provide a direct current directly or indirectly in the form of battery current.

The method enables an exact estimation or calculation of the RMS current of the intermediate-circuit capacitor independently of the driving method or pulse driving method, and an operating point, of the inverter. Thus, the method provides considerable advantages over the aforementioned known concept.

The present invention is generally suitable for estimating the RMS current of the intermediate-circuit capacitor for any arbitrary inverters. It is particularly suitable for estimating the RMS current of the intermediate-circuit capacitor for pulse-controlled inverters. The terms "inverter" and "pulse-controlled inverter" are therefore used synonymously in this description and in the claims, without further differentiation. The terms "effective current" and "rms current" or "RMS current" refer to the same current.

According to one embodiment of the method, the calculation specification calculates squares of electric charges flowing in switching components of the inverter as respective quadratic integrals, based on the supplied input variables. This enables an efficient and exact calculation of the RMS current to be estimated, for any arbitrary pulse patterns for driving the inverter.

According to another embodiment of the method for a symmetrical inverter or pulse-controlled inverter, a phase current of an Nth phase which is different from the N−1 phases is calculated based on the measured phase currents of the N−1 phases, and is supplied to the calculation specification as phase current of the Nth phase. Thus, rather than N phase current sensors, only N−1 phase current sensors are required, so that through the use of the method, a single phase current sensor may be eliminated and does not have to be provided at the electric machine. The option of using only N−1 phase current sensors for N phases utilizes the symmetry of the electric machine and of the inverter driving said machine.

According to another embodiment of the method, for at least one phase, preferably all of the N phases, the calculation specification calculates a time integral of a square of a phase current associated with the respective phase and supplied as an input variable, as a quadratic integral, based on the switching times associated with the phase and supplied as an input variable. This enables an efficient and exact calculation of the RMS current to be estimated, for any arbitrary pulse patterns for driving the inverter. This enables a particularly efficient and exact calculation of the RMS current to be estimated, for any arbitrary pulse patterns for driving the inverter.

According to another embodiment of the method, for two phases of the N phases, the calculation specification calculates a time integral of a product of the phase currents associated with these phases and supplied as input variables, as a mixed integral, based on the switching times associated with the phases and supplied as input variables.

The term "quadratic integral" is to refer uniformly to a time integral of a squared phase current which is measured or supplied to the calculation specification. Since the calculation of a time integral of a current, i.e., of the integration of the time-dependent current value over time or for the predefined switching times (in the sense of a switch-on time and a switch-off time of the current), defines a flowing electric charge, the quadratic integral may be understood to be the square of the charge or the squared current integral.

In this description, the term "mixed integral" is to refer uniformly to a time integral of a product of two phase currents which are measured or supplied to the calculation specification. A mixed integral having two phase currents to be multiplied identically yields a quadratic integral.

According to another refinement of the above embodiment of the method, for exactly two phases of the N=3 phases, the calculation specification calculates the time integral of the product of the phase currents associated with these phases and supplied as input variables, as a mixed integral, based on switching times associated with exactly one phase of the two phases and supplied as an input variable, wherein furthermore, the exactly two phases are preferably a phase having a second-smallest conductive period and a phase having a greatest conductive period, and wherein furthermore, the calculation is preferably carried out based only on the switching times associated with the phase having the second-smallest conductive period. This enables an extremely efficient and exact calculation of the RMS current to be estimated, for any arbitrary pulse patterns for driving the inverter.

The conductive period corresponds to the high level of the respective driving signal for one phase of the inverter, and in the case of normalization to the period of a PWM driving pattern, is also referred to as the duty factor, degree of modulation, or duty cycle (abbreviated by dyc).

According to another embodiment of the method, the calculation specification uses the predefined switching times for the determination of interval limits via the calculation specification, for time integrals to be calculated, wherein said specification preferably uses the predefined switching times as the interval limits. This enables a particularly efficient calculation of the RMS current to be estimated.

According to another embodiment of the method, for a respective phase, the calculation specification calculates a time integral of a squared supplied phase current, as a quadratic integral, and/or for two phases, the calculation specification calculates a time integral of a product of the phase currents associated with and supplied to these phases, as a mixed integral, by means of approximation of the respective supplied phase current via a quadratic function, in particular a second-order polynomial. This approximation, which is derived and explained in great detail below, enables a particularly efficient and simultaneously exact calculation of the RMS current to be estimated of the intermediate-circuit capacitor.

According to another embodiment of the method, the calculation specification calculates the quadratic integrals and the mixed integrals for any arbitrary pulse patterns, in particular differing from a flat-top pulse pattern, for driving the inverter, only for high-side switching components of the inverter. This enables a particularly efficient calculation of the RMS current to be estimated, for any arbitrary pulse patterns for driving the inverter.

Optionally or according to another embodiment of the method, for flat-top pulse patterns for driving the inverter, the calculation specification calculates the quadratic integrals and the mixed integrals only for low-side switching components of the inverter. For an inverter or pulse-controlled inverter having flat-top driving, this enables a reduction in the integrals to be calculated.

According to another embodiment of the method, the calculation specification calculates the RMS current to be estimated of the intermediate-circuit capacitor, as a sum of the calculated quadratic and mixed integrals, minus the predefined battery direct current, wherein the quadratic integral of the phase having the smallest conductive period enters the sum negatively. The summation of the integrals enables an efficient calculation of the RMS current.

In addition, an apparatus is provided for estimating an effective current or RMS current of an intermediate-circuit capacitor for an overall system made of a battery, an inverter, and an N-phase electric machine which is preferably designed as a synchronous machine, wherein in the overall system, the inverter is provided to convert direct-current power received by the battery for supplying the electric machine with N phase currents, and wherein the apparatus is designed for calculating the RMS current to be estimated of the intermediate-circuit capacitor according to a calculation specification, to which predefined switching times of the N phases of the machine, measured phase currents of N−1 phases or N phases of the electric machine, and a predefined battery direct current are supplied as input variables.

In addition, a use of one of the embodiments of the method depicted previously or below, or of one of the embodiments of the apparatus depicted previously or below, in a control apparatus or a regulation apparatus, in particular an inverter or pulse-controlled inverter, for an electric drive of an electric or hybrid vehicle, is provided as a method, with the purpose of monitoring or preventing damage to the electric drive, or to the inverter or pulse-controlled inverter.

Features of the present invention disclosed with respect to the method are also to be considered throughout to be disclosed with respect to the apparatus, and vice-versa.

The present invention and the described embodiments are not limited to a three-phase electric machine, but rather may be used for any arbitrary electric machines having N (N is an integer and greater than or equal to 1) phases. For the sake of simplicity of the following description, the following description discusses, by way of example, an electric machine having N=3 phases, i.e., a three-phase electric machine.

In order to improve the understanding of the present invention, exemplary embodiments will now be described. The following description also comprises a detailed derivation of the calculation specification for estimating the RMS current of the intermediate-circuit capacitor. This derivation will be performed with the aid of equations which are uniformly numbered in a main textual section as (x), etc., and are uniformly numbered in a secondary textual section as (Vx), etc. In the figures, the same or similar components or units are provided with the same reference numerals.

DETAILED DESCRIPTION

The invention is to be described in greater detail below based on the drawing. The following are shown.

DETAILED DESCRIPTION

Figure 1:
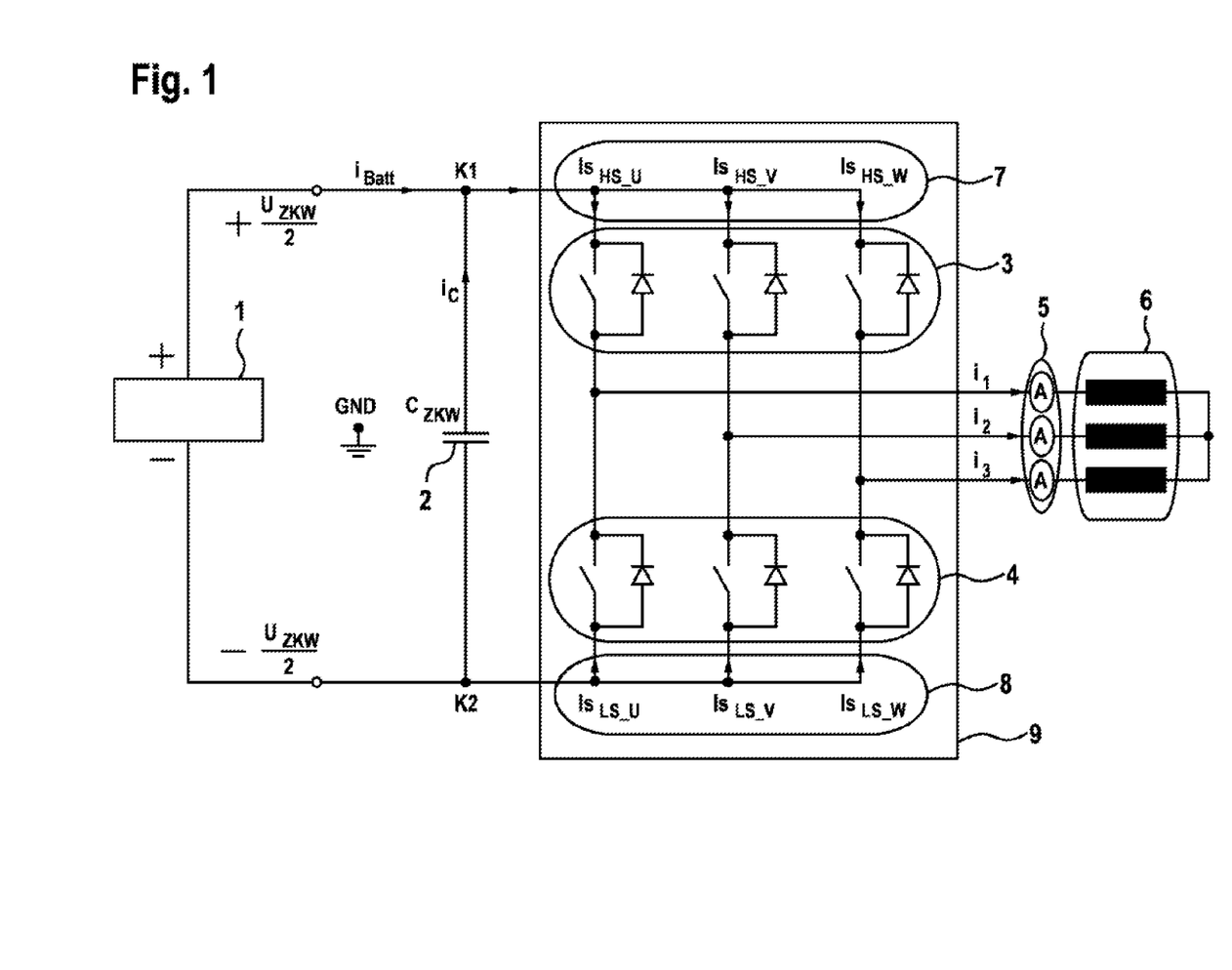
FIG. 1 shows an overall system.

An overall system, in which the method according to the present invention and the corresponding apparatus may be used, is to be presented initially, with reference to FIG. 1.

FIG. 1 depicts a battery 2, an inverter 9, and an electric machine 6. The battery 1 provides a DC voltage and a current $i_{Batt}$ for an input side of the inverter 9. An intermediate-circuit capacitor 2 is depicted between a contact point K1 which is conductively connected to the positive terminal of the battery 1 and a contact point K2 which is conductively connected to the negative terminal of the battery 1, having an associated current $i_C$.

The inverter 9 is designed as a pulse-controlled inverter for providing three phases U, V and W via a full bridge. An upper half or the high side 3 (abbreviated in the figures and the following formulas by "HS") of the full bridge comprises a respective parallel circuit made up of a power switch, embodied by an IGBT, and a power diode, for each phase U, V, and W. These three power switches and three power diodes are also referred to as high-side switching components or high-side power semiconductors of the inverter. A lower half or the low side 4 (abbreviated in the figures and the following formulas by "LS") of the full bridge is correspondingly or symmetrically designed with respect to the high side 3 and thus also comprises three power switches and three power diodes, which are also referred to as low-side switching components or low-side power semiconductors of the inverter.

The phase currents in the inverter 9 are indicated in FIG. 1 and the following derivations by IS and the respective phase U, V, or W and the respective input side into the inverter, i.e., HS for the high side and LS for the low side. The high-side phase currents are combined in FIG. 1, having the reference numeral 7. The low-side phase currents are combined in FIG. 1, having the reference numeral 8.

The electric machine 6 is a three-phase machine, the three phases of which being supplied with current via the previously described inverter 9. For measuring the phase currents of the electric machine, one phase current sensor from the three phase current sensors 5 is provided for each of the phases U, V, and W.

In order to simplify the description and to illustrate a particular advantage of the present invention, a symmetrical inverter will be assumed below. As will be described later, it is then sufficient for the method and the apparatus that only two of the three phase currents of the electric machine are measured using only two phase current sensors 5.

The calculation via the calculation specification of the method and the corresponding apparatus is to be derived below.

For this purpose, the node equation for node K1 is initially formed in FIG. 1. The following equation (1) is obtained:

$$(K1): \Rightarrow_{Bat.} = i_C + Is_{HS\_U} + Is_{HS\_V} + Is_{HS\_W}$$

$$\Rightarrow i_{Batt} - i_C = Is_{HS\_U} + Is_{HS\_V} + Is_{HS\_W} \quad (1)$$

To calculate the RMS current $I_{C,rms}$ of the intermediate-circuit capacitor $C_{ZWK}$, equation (1) must be squared on both sides:

$$(i_{Batt} - i_C)^2 = (Is_{HS\_U} + Is_{HS\_V} + Is_{HS\_W})^2 \quad (2)$$

The solution to this binomial equation yields:

$$(i_{Batt}^2 - 2i_{Batt} \cdot i_C + i_C^2) = \quad (3)$$

$$\begin{pmatrix} Is_{HS\_U}^2 + Is_{HS\_V}^2 + Is_{HS\_W}^2 + 2 \cdot Is_{HS\_U} \cdot Is_{HS\_V} + \\ 2 \cdot Is_{HS\_U} \cdot Is_{HS\_W} + 2 \cdot Is_{HS\_V} \cdot Is_{HS\_W} \end{pmatrix}$$

Integration will now be performed on both sides of equation (3) over one PWM period. In doing so, the switching times are normalized. The following equation (4) is obtained:

$$\left( \int_0^1 i_{Batt}^2 dt - 2\int_0^1 i_{Batt} i_C dt + \int_0^1 i_C^2 dt \right) = \quad (4)$$

$$\begin{pmatrix} \int_0^1 Is_{HS\_U}^2 dt + \int_0^1 Is_{HS\_V}^2 dt + \int_0^1 Is_{HS\_W}^2 dt + 2\int_0^1 Is_{HS\_U} Is_{HS\_V} dt + \\ 2\int_0^1 Is_{HS\_U} Is_{HS\_W} dt + 2\int_0^1 Is_{HS\_V} Is_{HS\_W} dt \end{pmatrix}$$

Since the DC current at the intermediate-circuit capacitor viewed over one electric period is equal to zero, the following is true:

$$-2\int_0^1 i_{Batt} \cdot i_C \cdot dt = 0$$

If integral limits are applied to equation (4), the following equation (5) is obtained, which is to be solved:

$$\int_0^1 i_C^2 dt = \underbrace{\int_{t_{on,U}}^{t_{off,U}} Is_{HS\_U}^2 dt}_{Q_{SqHS\_U}} + \underbrace{\int_{t_{on,V}}^{t_{off,V}} Is_{HS\_V}^2 dt}_{Q_{SqHS\_V}} + \quad (5)$$

$$\underbrace{\int_{t_{on,W}}^{t_{off,W}} Is_{HS\_W}^2 dt}_{Q_{SqHS\_W}} + 2\int_{t_{on,U};t_{on,V}}^{t_{off,U};t_{off,V}} Is_{HS\_U} Is_{HS\_V} dt +$$

$$2\int_{t_{on,U};t_{on,W}}^{t_{off,U};t_{off,W}} Is_{HS\_U} Is_{HS\_W} dt + 2\int_{t_{on,V};t_{on,W}}^{t_{off,V};t_{off,W}} Is_{HS\_V} Is_{HS\_W} dt - I_B^2$$

It will now be described or derived how the first three terms of equation (5), $Q_{SqHS\_U}$, $Q_{SqHS\_V}$, $Q_{SqHS\_W}$, i.e., the quadratic integrals, can be ascertained.

For this purpose, a particularly efficient approximation method will be used for calculating current integrals or the charges in the switching components of the inverter. This approximation method comprises a normalization of the switching times of the inverter, an approximation of a respective phase current via a quadratic equation, and an evaluation of the PWM drive pulse patterns for calculating the electric charges flowing in the components, i.e., in the power semiconductors, of the inverter, or for calculating the corresponding current integrals and quadratic integrals.

Normalization of the switching times, initially designated as $t_{Ein}$ and $t_{Aus}$, within one period of a PWM driving pattern, is necessary for simplifying the current integrals to be determined, and for maintaining the calculation validity for various switching frequencies. The normalized ("Nrm") switching times are calculated as follows:

$$t_{Ein,Nrm} = \frac{t_{Ein}}{T_{PWM}}, \quad t_{Aus,Nrm} = \frac{t_{Aus}}{T_{PWM}} \quad (V5)$$

Here, $T_{PWM}$ is the period of one PWM driving pattern.

The current profile of any arbitrary phase (thus without designation) will now be approximated by a second-order polynomial. Such a polynomial may generally be described by:

$$I(t) = at^2 + bt + c \quad (V6)$$

Using normalization, the following is obtained:

$$I(t_{Nrm}) = at_{Nrm}^2 + bt_{Nrm} + c \quad (V7)$$

For the interpolation, it is determined that this polynomial runs through the points $$P_1(-T_{PWM}|I(k-1)); P_2(0|I(k)); P_3(T_{PWM}|I(k+1)).$$

Due to the normalization, the following is accordingly obtained:

$$P_1(-1|I(k-1)); P_2(0|I(k)); P_3(1|I(k+1))$$

The coefficients a, b, c of equation (V7) are derived using Lagrange polynomial interpolation.

$$a = \frac{I(k-1) - 2 \cdot I(k) + I(k+1)}{2}$$
$$b = \frac{I(k+1) - I(k-1)}{2} \Rightarrow I(t_{Nrm}) = $$
$$c = I(k)$$
(V8)

$$\frac{I(k-1) - 2 \cdot I(k) + I(k+1)}{2} \cdot t_{Nrm}^2 + \frac{I(k+1) - I(k-1)}{2} \cdot t_{Nrm} + I(k)$$

The real sinusoidal current profile is then assumed in the interval under consideration to be a quadratic function. The interpolated function provides a fairly exact approximation. The approximation accuracy decreases with increasing frequency.

The evaluation of the PWM drive pulse patterns for calculating the electric charges flowing in the switching components, i.e., in the power semiconductors, of the inverter, or for calculating the corresponding current integrals, will now be considered.

The objective of this section is to calculate the linear and quadratic current integrals of the high-/low-side switching components of the inverter. The quadratic current integrals are the aforementioned quadratic integrals.

The following are generally applicable for calculating the electric charge of the high-side components:

$$Q_{HS} = \int_{t_{Ein}}^{t_{Aus}} I(t) \cdot dt$$
(V9)
$$Q_{Sq,HS} = \int_{t_{Ein}}^{t_{Aus}} I(t)^2 \cdot dt$$

Normalization of these integrals according to (V5) yields:

$$Q_{HS} = T_{PWM} \cdot \int_{t_{Ein}}^{t_{Aus}} I(t_{Nrm}) \cdot dt_{Nrm}$$
(V10)
$$Q_{SqHS} = T_{PWM} \cdot \int_{t_{Ein}}^{t_{Aus}} I(t_{Nrm})^2 \cdot dt_{Nrm}$$

Finally, for calculating the normalized electric charge, the following is obtained:

$$Q_{HS} = T_{PWM} \cdot \left( \int_{t_{Ein,Nrm}}^{t_{Aus,Nrm}} I(t_{Nrm}) \cdot dt_{Nrm} \right) = $$
(V11)
$$T_{PWM} \cdot \left( \int_{t_{Ein,Nrm}}^{t_{Aus,Nrm}} (a \cdot t_{Nrm}^2 + b \cdot t_{Nrm} + c) dt_{Nrm} \right) = $$
$$T_{PWM} \cdot \left[ \frac{a}{3} \cdot (t_{Aus,Nrm}^3 - t_{Ein,Nrm}^3) + \frac{b}{2} \cdot (t_{Aus,Nrm}^2 - t_{Ein,Nrm}^2) + c \cdot (t_{Aus,Nrm} - t_{Ein,Nrm}) \right]$$

The square of the normalized electric charge yields:

$$Q_{SqHS} = T_{PWM} \cdot \left( \int_{t_{Ein,Nrm}}^{t_{Aus,Nrm}} I(t_{Nrm})^2 \cdot dt_{Nrm} \right) = $$
(V12)
$$T_{PWM} \cdot \left( \int_{t_{Ein,Nrm}}^{t_{Aus,Nrm}} (a \cdot t_{Nrm}^2 + b \cdot t_{Nrm} + c)^2 \cdot dt_{Nrm} \right) = $$

$$\frac{T_{PWM}}{30} [6a^2(t_{Aus,Nrm}^5 - t_{Ein,Nrm}^5) + $$
$$15ab(t_{Aus,Nrm}^4 - t_{Ein,Nrm}^4) + 10b^2(t_{Aus,Nrm}^3 - t_{Ein,Nrm}^3)] + $$
$$c \cdot T_{PWM} \left[ \frac{2}{3} a(t_{Aus,Nrm}^3 - t_{Ein,Nrm}^3) + b(t_{Aus,Nrm}^2 - t_{Ein,Nrm}^2) \right] + $$
$$c^2 \cdot T_{PWM} (t_{Aus,Nrm} - t_{Ein,Nrm})$$

For calculating the electric charge of the low-side switching components of the inverter, the complete integrals are also required, in addition to the high-side integrals. Equations (V13) and (V14) describe the complete integral and the associated quadratic integral.

$$Q_{Tot} = T_{PWM} \cdot \int_0^1 I(t_{Nrm}) \cdot dt = $$
(V13)
$$T_{PWM} \cdot \left( \int_0^1 (a \cdot t_{Nrm}^2 + b \cdot t_{Nrm} + c) dt_{Nrm} \right) = T_{PWM} \cdot \left[ \frac{a}{3} + \frac{b}{2} + c \right]$$

$$Q_{SqTot} = T_{PWM} \cdot \left( \int_0^1 I(t_{Nrm})^2 \cdot dt_{Nrm} \right)$$
(V14)
$$= T_{PWM} \cdot \left( \int_0^1 (a \cdot t_{Nrm}^2 + b \cdot t_{Nrm} + c)^2 \cdot dt_{Nrm} \right)$$
$$= \frac{T_{PWM}}{30} [6a^2 + 15ab + 10b^2] + c \cdot T_{PWM} \left[ \frac{2}{3} a + b \right] + $$
$$c^2 \cdot T_{PWM}$$

Equations (V15) and (V16) are obtained for calculating the low-side switching components.

$$Q_{LS} = Q_{Tot} - Q_{HS}$$
(V15)

$$Q_{SqLS} = Q_{SqTot} - Q_{SqHS}$$
(V16)

The associated current integrals of the high-side and low-side power semiconductors of one phase of the system under consideration are calculated below, based on the different pulse patterns or pulse pattern types which possibly occur.

For application to an N-phase system, the associated switch-on/switch-off times (the predefined switching times), and the associated phase current of each phase are to be used in equations (V17*), (V18*), (V19*), and (V20*) for calculating the current integrals of the high-side and low-side power semiconductors of each phase and of the associated quadratic integrals.

In this context, the following convention is established with respect to the aforementioned equations:
- (V17*)→electric charge or the current integral of the high-side power semiconductors of phase X of the system under consideration
- (V18*)→square of the electric charge, or the quadratic integral of the high-side power semiconductors of phase X of the system under consideration
- (V19*)→electric charge or the current integral of the low-side power semiconductor of phase X of the system under consideration
- (V20*)→square of the electric charge, or the quadratic integral of the low-side power semiconductors of phase X of the system under consideration Here, (*) refers to the simplification which has been made, in which the power semiconductors have ideal switch-on/switch-off processes.

As mentioned earlier, the calculation specification may carry out the calculation of the flowing electric charges only for the switching components, i.e., the power semiconductors, associated with the high side, or only for the switching components associated with the low side, as a function of a type of a pulse driving method via which the inverter is driven. In this case, the half of the full bridge, i.e., the high side or low side, which does not require that the total charge is also calculated according to equation (V13), should be used for the calculation of the charge. In addition, the time interval of the respective phase may be advantageously determined based on the predefined switching times of this respective phase, in order to simplify the calculation of the integrals.

The following pulse driving methods or types may be differentiated for determining (V17*), (V18*), (V19*), and (V20*).

The so-called center-aligned PWM pattern over one period is depicted in section A of FIG. 2.

Figure 2A:
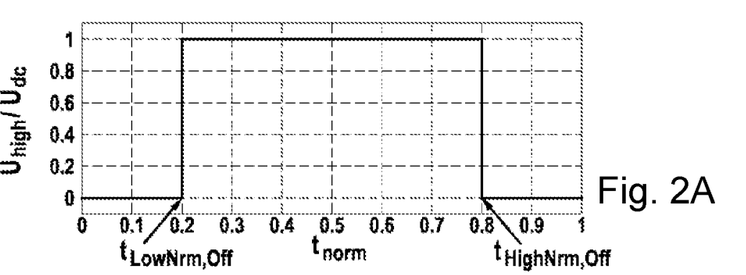
FIGS. 2A to 2D show a center-aligned PWM pattern, a center-aligned inverted PWM pattern, a left-aligned PWM pattern, and a right-aligned PWM pattern, over one period.

The following are obtained for the high side:

$$Q_{HS} = T_{PWM} \cdot \int_{t_{LowNrm,off}}^{t_{HighNrm,Off}} I(t_{Nrm}) \cdot dt_{Nrm} \quad (V17^*)$$

$$Q_{SqHS} = T_{PWM} \cdot \int_{t_{LowNrm,off}}^{t_{HighNrm,Off}} I^2(t_{Nrm}) \cdot dt_{Nrm} \quad (V18^*)$$

The following are obtained for the low side:

$$Q_{LS} = Q_{Tot} - Q_{HS} \quad (V19^*)$$

$$Q_{SqLS} = Q_{SqTot} - Q_{SqHS} \quad (V20^*)$$

The so-called center-aligned-inverted PWM pattern over one period is depicted in section B of FIG. 2.

Figure 2B:
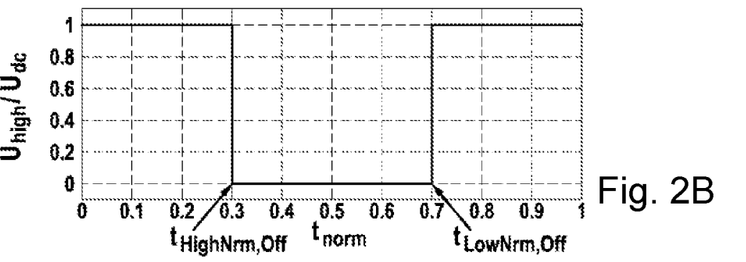

In the case of this pulse pattern, it is convenient to initially calculate the current integral for the low side.

$$Q_{LS} = T_{PWM} \cdot \int_{t_{HighNrm,off}}^{t_{LowNrm,Off}} I(t_{Nrm}) \cdot dt_{Nrm} \quad (V19^*)$$

$$Q_{SqLS} = T_{PWM} \cdot \int_{t_{HighNrm,off}}^{t_{LowNrm,Off}} I^2(t_{Nrm}) \cdot dt_{Nrm} \quad (V20^*)$$

The following are obtained for the high side:

$$Q_{HS} = Q_{Tot} - Q_{LS} \quad (V17^*)$$

$$Q_{SqHS} = Q_{SqTot} - Q_{SqLS} \quad (V18^*)$$

The so-called left-aligned PWM pattern over one period is depicted in section C of FIG. 2.

Figure 2C:
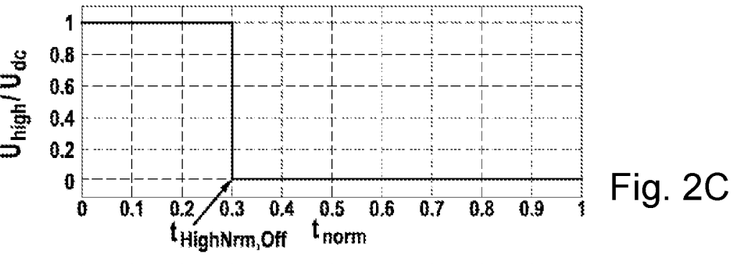

In the case of the left-aligned PWM pattern, the switch-on time is equal to zero $t_{LowNrm,Off}=0$.

The following are thus obtained for the high side:

$$Q_{HS} = T_{PWM} \cdot \int_{0}^{t_{HighNrm,Off}} I(t_{Nrm}) \cdot dt_{Nrm} \quad (V17^*)$$

$$Q_{SqHS} = T_{PWM} \cdot \int_{0}^{t_{HighNrm,Off}} I^2(t_{Nrm}) \cdot dt_{Nrm} \quad (V18^*)$$

The following are obtained for the low side:

$$Q_{LS} = Q_{Tot} - Q_{HS} \quad (V19^*)$$

$$Q_{SqLS} = Q_{SqTot} - Q_{SqHS} \quad (V20^*)$$

The so-called right-aligned PWM pattern over one period is depicted in section D of FIG. 2.

Figure 2D:
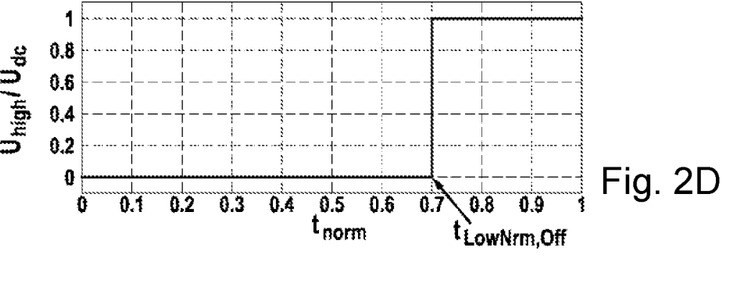

In the case of the right-aligned PWM pattern, the switch-off time is equal to zero due to $t_{HighNrm,Off}=1$. The following are thus obtained for the high side:

$$Q_{HS} = T_{PWM} \cdot \int_{t_{LowNrm,off}}^{1} I(t_{Nrm}) \cdot dt_{Nrm} \quad (V17^*)$$

$$Q_{SqHS} = T_{PWM} \cdot \int_{t_{LowNrm,off}}^{1} I^2(t_{Nrm}) \cdot dt_{Nrm} \quad (V18^*)$$

The following are obtained for the low side:

$$Q_{LS} = Q_{Tot} - Q_{HS} \quad (V19^*)$$

$$Q_{SqLS} = Q_{SqTot} - Q_{SqHS} \quad (V20^*)$$

Figure 3A:
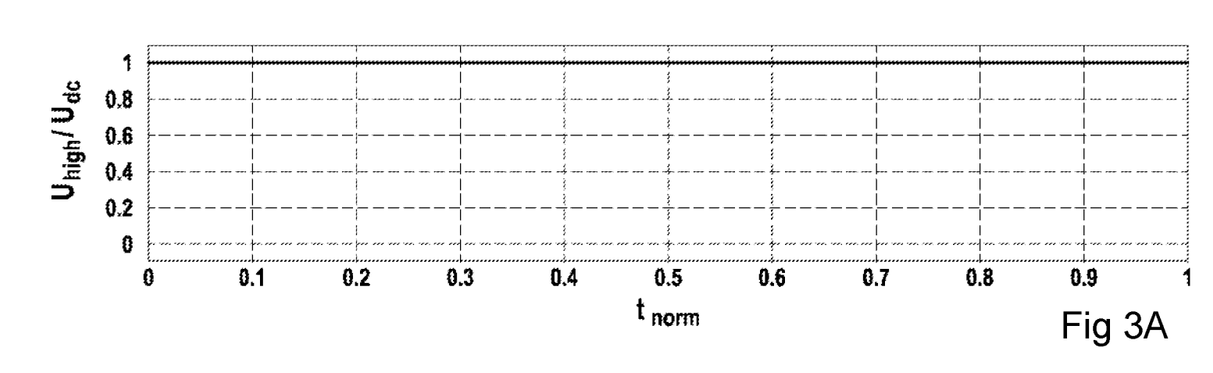
FIGS. 3A and 3B show an only-high PWM pattern and an only-low PWM pattern, over one period.

The so-called only-high PWM pattern over one period is depicted in section A of FIG. 3. In this pulse pattern, only the complete integral is used. The current integrals are therefore:

$$Q_{HS} = Q_{Tot} \quad (V17^*)$$

$$Q_{SqHS} = Q_{SqTot} \quad (V18^*)$$

$$Q_{LS} = 0 \quad (V19^*)$$

$$Q_{SqLS} = 0 \quad (V20^*)$$

Figure 3B:
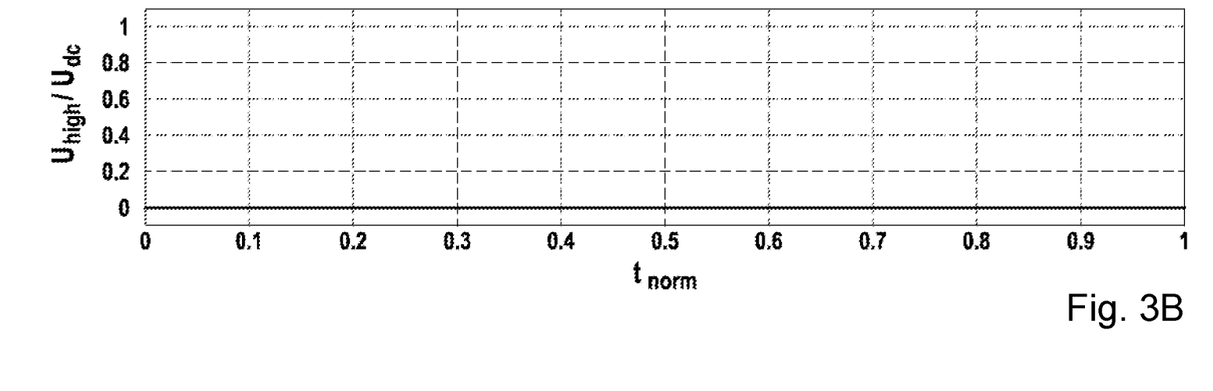

The so-called only-low PWM pattern over one period is depicted in section B of FIG. 3. In the case of this pulse pattern, only the complete integral is used, exactly as in the only-high PWM. The current integrals are therefore:

$$Q_{HS} = 0 \quad (V17^*)$$

$$Q_{SqHS} = 0 \quad (V18^*)$$

$$Q_{LS} = Q_{Tot} \quad (V19^*)$$

$$Q_{SqLA} = Q_{SqTot} \quad (V20^*)$$

After the first three terms of equation (5), $Q_{SqHS\_U}$, $Q_{SqHS\_V}$, $Q_{SqHS\_W}$, i.e., the quadratic integrals, are able to be ascertained as a function of the pulse pattern according to the above depictions, the calculation of the mixed integrals in equation (5) is now to be depicted.

Figure 4A:
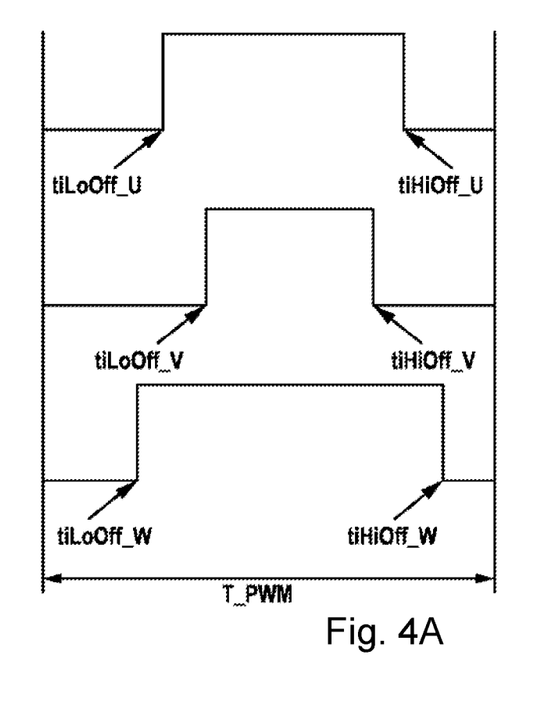
FIGS. 4A and B show a center-aligned pulse pattern and a flat-top pulse pattern.

In this case, it is important to mention that the result of the two mixed products, in which the high-side current having the smallest conductive period is contained, is equal to the negative double of the square of the current integral, i.e., of the quadratic integral, having the smallest conductive period. This is explained below using the example of the center-aligned pulse pattern illustrated in section A of FIG. 4.

Initially, the mixed integrals of the phase having the shortest conductive period are calculated. They are carried out in equation (6). To calculate the mixed integral, only the region must be taken into consideration in which the two phases are active or conduct the current. Otherwise, the mixed integral is zero in this region. Since, in the present exemplary case, phase V has the smallest conductive period, its switch-on/switch-off times are to be used as integral limits for calculating the two integrals. Due to the same integral limits for the two mixed integrals, the equation may be simplified by factoring out the current having the smallest conductive period.

$$2 \cdot \int_{tiLoOff\_V}^{tiHiOff\_V} Is_U(t) \cdot Is_V(t) \cdot dt + 2 \cdot \int_{tiLoOff\_V}^{tiHiOff\_V} Is_U(t) \cdot Is_W(t) \cdot dt = \quad (6)$$

$$2 \cdot \int_{tiLoOff\_V}^{tiHiOff\_V} Is_V(t) \cdot [Is_U(t) + Is_W(t)] \cdot dt$$

Assuming a symmetrical drive system, the following is true:

$$Is_U + Is_V + Is_W = 0 \Rightarrow Is_U + Is_W = -Is_V$$

Thus, (6) yields the following:

$$2 \cdot \int_{tiLoOff\_V}^{tiHiOff\_V} Is_U \cdot Is_V \, dt + 2 \cdot \int_{tiLoOff\_V}^{tiHiOff\_V} Is_U \cdot Is_W \, dt = \quad (7)$$

$$-2 \cdot \underbrace{\int_{tiLoOff\_V}^{tiHiOff\_V} Is_V^2 \cdot dt}_{Q_{SqHS\_V}} \Rightarrow$$

$$2 \cdot \int_{tiLoOff\_V}^{tiHiOff\_V} Is_U \cdot Is_V \, dt + 2 \cdot \int_{tiLoOff\_V}^{tiHiOff\_V} Is_U \cdot Is_W \, dt = -2 \cdot Q_{SqHS\_V}$$

If (7) is inserted into (5), the following is obtained:

$$\int_0^1 i_C^2 \, dt = \quad (8)$$

$$Q_{SqHS\_U} - Q_{SqHS\_V} + Q_{SqHS\_W} + 2 \cdot \int_{tiLoOff\_U}^{tiHiOff\_U} Is_U \cdot Is_W \, dt - I_{Batt}^2$$

Thus, the following is obtained for the equation for calculating the RMS current $I_{C,rms}$ of the intermediate-circuit capacitor:

$$I_{C,rms} = \sqrt{\frac{1}{T_{PWM}} \cdot \int_0^{T_{PWM}} i_C^2 \, dt} = \frac{\sqrt{\underbrace{Q_{SqHS\_U} - Q_{SqHS\_V} + Q_{SqHS\_W} + 2 \cdot \int_{tiLoOff\_U}^{tiHiOff\_U} Is_U(t) \cdot Is_W(t) \cdot dt - I_{Batt}^2}_{Q_{ZWK,rms,Sq}}}}{T_{PWM}} \quad (9)$$

Now, only the mixed integral $$2 \cdot \int_{tiLoOff\_U}^{tiHiOff\_U} Is_U(t) \cdot Is_W(t) \, dt$$

must be calculated.

This is calculable with knowledge of the present pulse pattern, as depicted below.

A general formula for calculating the RMS current $I_{C,rms}$ of the intermediate-circuit capacitor thus yields:

$$I_{c,rms}^2 = \pm Q_{SqHS\_U} \pm Q_{SqHS\_V} \pm Q_{SqHS\_W} + \quad (10)$$

$$2 \cdot \int_{tiLoOff\_X}^{tiHiOff\_X} Is_{HS\_X} \cdot Is_{HS\_Y} \, dt - I_{Batt}^2$$

With respect to this general formula (10), the following rules apply:

The quadratic integral of the phase having the smallest conductive period carries the negative sign.

The quadratic integrals of the phases having the second-smallest conductive period and the largest conductive period carry the positive sign.

The integral limits of the mixed integral to be calculated relate to the switch-on/switch-off times, i.e., the pre-defined switching times, of the phase having the second-smallest conductive period.

$Is_{HS\_X}$ denotes the phase current having the second-smallest conductive period.

$Is_{HS\_Y}$ denotes the phase current having the largest conductive period.

Here, a distinction is made between the following cases:

1. Fall: $dyc_U < dyc_V < dyc_W$ (10-1)

$$I_{c,rms}^2 = -Q_{SqHS\_U} + Q_{SqHS\_V} +$$

$$Q_{SqHS\_W} + 2 \cdot \int_{tiLoOff\_V}^{tiHiOff\_V} Is_{HS\_W} \cdot Is_{HS\_V} \, dt - I_{Batt}^2$$

2. Fall: $dyc_U < dyc_W < dyc_V$ (11)

$$I_{c,rms}^2 = -Q_{SqHS\_U} + Q_{SqHS\_V} +$$

$$Q_{SqHS\_W} + 2 \cdot \int_{tiLoOff\_W}^{tiHiOff\_W} Is_{HS\_W} \cdot Is_{HS\_V} \, dt - I_{Batt}^2$$

3. Fall: $dyc_V < dyc_W < dyc_U$ (12)

$$I_{c,rms}^2 = Q_{SqHS\_U} - Q_{SqHS\_V} +$$

$$Q_{SqHS\_W} + 2 \cdot \int_{tiLoOff\_W}^{tiHiOff\_W} Is_{HS\_W} \cdot Is_{HS\_U} \, dt - I_{Batt}^2$$

4. Fall: $dyc_V < dyc_U < dyc_W$ (13)

-continued $$I_{c,rms}^2 = Q_{SqHS\_U} - Q_{SqHS\_V} +$$

$$Q_{SqHS\_W} + 2 \cdot \int_{tiLoOff\_U}^{tiHiOff\_U} Is_{HS\_W} \cdot Is_{HS\_U} \, dt - I_{Batt}^2$$

5. Fall: $dyc_W < dyc_V < dyc_U$ (14)

$$I_{c,rms}^2 = Q_{SqHS\_U} + Q_{SqHS\_V} -$$

$$Q_{SqHS\_W} + 2 \cdot \int_{tiLoOff\_V}^{tiHiOff\_V} Is_{HS\_U} \cdot Is_{HS\_V} \, dt - I_{Batt}^2$$

6. Fall: $dyc_W < dyc_U < dyc_V$ (15)

$$I_{c,rms}^2 = Q_{SqHS\_U} + Q_{SqHS\_V} -$$

$$Q_{SqHS\_W} + 2 \cdot \int_{tiLoOff\_U}^{tiHiOff\_U} Is_{HS\_U} \cdot Is_{HS\_V} \, dt - I_{Batt}^2$$

According to the above formulas (10) to (15), the RMS current $I_{C,rms}$ of the intermediate-circuit capacitor is calculated for any arbitrary pulse patterns for driving the inverter, only for, or based on, the high-side switching components, or the electric charges flowing therein.

Figure 4B:
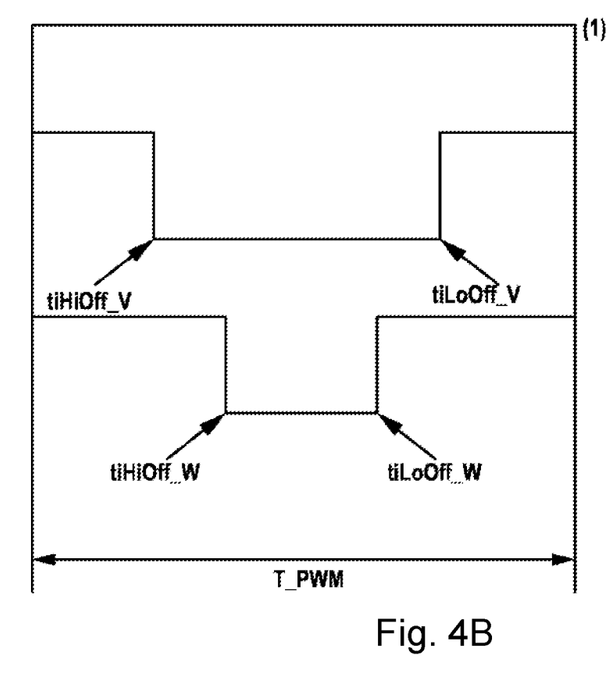

A special case is obtained for the flat-top pulse pattern, which is illustrated in section B of FIG. 4. In the case of the flat-top pulse pattern, it is advantageous to switch the calculation to the low-side switching components, since the calculation of the RMS current may thereby be simplified.

Considering node K2 in FIG. 1, the following is obtained:

$$(K2) \Rightarrow i_{Batt} = i_c + Is_{LS\_U} + Is_{LS\_V} + Is_{LS\_W}$$

$$\Rightarrow i_{Batt} - i_C = Is_{LS\_U} + Is_{LS\_V} + Is_{LS\_V} \quad (16)$$

In a similar manner to equation (10), the following is obtained:

$$I_{c,rms}^2 = \pm Q_{SqLS\_U} \pm Q_{SqLS\_V} \pm Q_{SqLS\_W} + 2 \cdot \int_{tiLoOff\_X}^{tiHiOff\_X} Is_{LS\_X} \cdot Is_{LS\_Y} \, dt - I_{Batt}^2 \quad (17)$$

Thus, the following cases may be derived:

1. Fall: $dyc_U < dyc_V < dyc_W$ (18)

$$I_{c,rms}^2 = -Q_{SqLS\_U} + Q_{SqLS\_V} + Q_{SqLS\_W} + 2 \cdot \int_{tiLoOff\_V}^{tiHiOff\_V} Is_{LS\_W} \cdot Is_{LS\_V} \, dt - I_{Batt}^2$$

2. Fall: $dyc_U < dyc_W < dyc_V$ (19)

$$I_{c,rms}^2 = -Q_{SqLS\_U} + Q_{SqLS\_V} + Q_{SqLS\_W} + 2 \cdot \int_{tiLoOff\_W}^{tiHiOff\_W} Is_{LS\_W} \cdot Is_{LS\_V} \, dt - I_{Batt}^2$$

3. Fall: $dyc_V < dyc_W < dyc_U$ (20)

$$I_{c,rms}^2 = Q_{SqLS\_U} - Q_{SqLS\_V} + Q_{SqLS\_W} + 2 \cdot \int_{tiLoOff\_W}^{tiHiOff\_W} Is_{LS\_W} \cdot Is_{LS\_U} \, dt - I_{Batt}^2$$

4. Fall: $dyc_V < dyc_U < dyc_W$ (21)

$$I_{c,rms}^2 = Q_{SqLS\_U} - Q_{SqLS\_V} + Q_{SqLS\_W} + 2 \cdot \int_{tiLoOff\_U}^{tiHiOff\_U} Is_{LS\_W} \cdot Is_{LS\_U} \, dt - I_{Batt}^2$$

5. Fall: $dyc_W < dyc_V < dyc_U$ (22)

$$I_{c,rms}^2 = Q_{SqLS\_U} + Q_{SqLS\_V} - Q_{SqLS\_W} + 2 \cdot \int_{tiLoOff\_V}^{tiHiOff\_V} Is_{LS\_U} \cdot Is_{LS\_V} \, dt - I_{Batt}^2$$

6. Fall: $dyc_W < dyc_U < dyc_V$ (23)

$$I_{c,rms}^2 = Q_{SqLS\_U} + Q_{SqLS\_V} - Q_{SqLS\_W} + 2 \cdot \int_{tiLoOff\_U}^{tiHiOff\_U} Is_{LS\_U} \cdot Is_{LS\_V} \, dt - I_{Batt}^2$$

According to the above formulas (17) to (23), the RMS current $I_{C,rms}$ of the intermediate-circuit capacitor is calculated for the flat-top pulse pattern for driving the inverter, only for, or based on, the low-side switching components, or the electric charges flowing therein.

Figure 5:
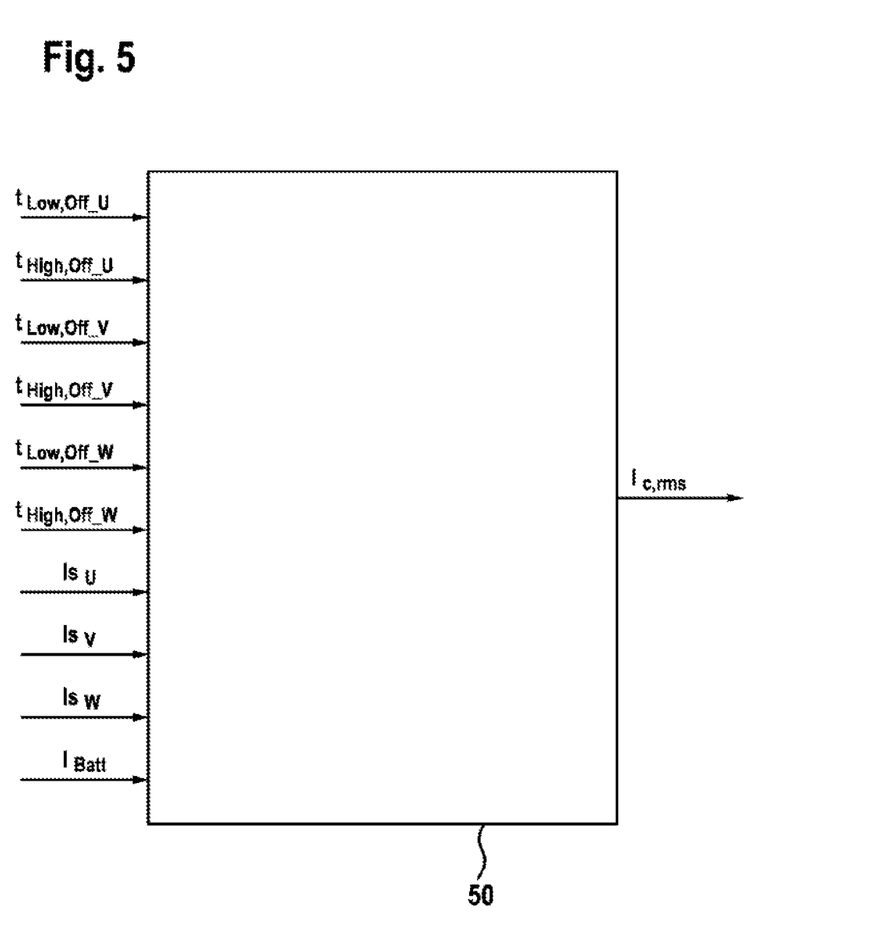
FIG. 5 shows an apparatus for estimating the RMS current of the intermediate-circuit capacitor.

FIG. 5 illustrates an apparatus 50 for estimating the RMS current of the intermediate-circuit capacitor for an electric machine supplied with three-phase current. As shown in FIG. 5, the apparatus 50 is designed to receive six switching time values, i.e., two switching times per phase, three measured phase currents of the three phases of the electric machine, and the battery direct current, as input variables, and to use the input variables for calculating the RMS current of the intermediate-circuit capacitor according to the calculation specification described above. For a symmetrical system, one of the phase current inputs may be omitted, since the phase current of the third phase may be calculated from the measured phase currents of two phases in the apparatus 50.

The invention claimed is:

1. A method for estimating an RMS current ($I_{C,rms}$) of an intermediate-circuit capacitor ($C_{ZWK}$) for an overall system including a battery (1), an inverter (9), and an N-phase electric machine (6), the method comprising:
   converting, with the inverter (9), direct-current power received by the battery (1) for supplying the electric machine with N phase currents, and
   determining an estimated RMS current ($I_{C,rms}$) of the intermediate-circuit capacitor according to a calculation specification, to which predefined switching times ($t_{Low,Off}$, $t_{High,Off}$) of the N phases of the electric machine, measured phase currents ($IS_U$, $IS_V$, $IS_W$) of N−1 phases or N phases of the electric machine, and a predefined battery direct current ($I_{Batt}$) are supplied as input variables, and wherein
   (a) for a respective phase, the calculation specification calculates a time integral of a squared supplied phase current, as a quadratic integral,
   (b) for two phases, the calculation specification calculates a time integral of a product of the phase currents associated with and supplied to these phases, as a mixed integral, by means of approximation of the respective supplied phase current via a quadratic function, or
   both (a) and (b).

2. The method as claimed in claim 1, wherein the calculation specification calculates squares of electric charges flowing in switching components of the inverter ($Q_{SqHS\_U}$, $Q_{SqHS\_V}$, $Q_{SqHS\_W}$; $Q_{SqLS\_U}$, $Q_{SqLS\_V}$, $Q_{SqLS\_W}$) as respective quadratic integrals based on the supplied input variables.

3. The method as claimed in claim 1, wherein a phase current of an Nth phase which is different from the N−1 phases is calculated based on the measured phase currents of the N−1 phases, and is supplied to the calculation specification as phase current of the Nth phase.

4. The method as claimed in claim 1, wherein for at least one phase, the calculation specification calculates the time integral of a square of the phase current associated with the phase and supplied as an input variable, as the quadratic integral, further based on the switching times ($t_{Low,Off}$, $t_{High,Off}$) associated with the phase and supplied as an input variable.

5. The method as claimed in claim 1, wherein for two phases of the N phases, the calculation specification calculates the time integral of a product of the phase currents associated with these phases and supplied as input variables, as the mixed integral further based on the switching times ($t_{Low,Off}$, $t_{High,Off}$) associated with the phases and supplied as input variables.

6. The method as claimed in claim 5, wherein for exactly two phases of the N=3 phases, the calculation specification calculates the time integral of the product of the phase currents associated with these phases and supplied as input variables, as the mixed integral further based on switching times ($t_{Low,Off}$, $t_{High,Off}$) associated with exactly one phase of the two phases and supplied as an input variable.

7. The method as claimed in claim 1, wherein the calculation specification uses the predefined switching times ($t_{Low,Off}$, $t_{High,Off}$) for the determination of interval limits via the calculation specification for the time integrals to be calculated.

8. The method as claimed in claim 1, wherein
   (a) the quadratic integrals and the mixed integrals are calculated for arbitrary pulse patterns, for driving the inverter, only for high-side switching components of the inverter,
   (b) for flat-top pulse patterns for driving the inverter, the quadratic integrals and the mixed integrals are calculated only for low-side switching components of the inverter, or
   both (a) and (b).

9. An apparatus for estimating an RMS current ($I_{C,rms}$) of an intermediate-circuit capacitor ($C_{ZWK}$) for an overall system including a battery (1), an inverter (9), and an N-phase electric machine (6), wherein in the overall system, the inverter (9) is provided to convert direct-current power received by the battery (1) for supplying the electric machine with N phase currents, and wherein the apparatus is designed to calculate the RMS current ($I_{C,rms}$) to be estimated of the intermediate-circuit capacitor according to a calculation specification, to which predefined switching times ($t_{Low,Off}$, $t_{High,Off}$) of the N phases of the electric machine, measured phase currents ($IS_U$, $IS_V$, $IS_W$) of N−1 phases or N phases of the electric machine, and a predefined battery direct current ($I_{Batt}$) are supplied as input variables and wherein
   (a) for a respective phase, the calculation specification calculates a time integral of a squared supplied phase current, as a quadratic integral,
   (b) for two phases, the calculation specification calculates a time integral of a product of the phase currents associated with and supplied to these phases, as a mixed integral, by means of approximation of the respective supplied phase current via a quadratic function, or
   both (a) and (b).

10. The method as claim in claim 8, wherein the RMS current ($I_{C,rms}$) of the intermediate-circuit capacitor is calculated and estimated as a sum of the calculated quadratic and mixed integrals, minus the predefined battery direct current ($I_{Batt}$), wherein the quadratic integral of the phase having the smallest conductive period enters the sum negatively.

* * * * *